US006649038B2

(12) United States Patent
Mikkola et al.

(10) Patent No.: US 6,649,038 B2
(45) Date of Patent: Nov. 18, 2003

(54) ELECTROPLATING METHOD

(75) Inventors: Robert D. Mikkola, Grafton, MA (US); Jeffrey M. Calvert, Acton, MA (US); Denis Morrissey, Huntington, NY (US)

(73) Assignee: Shipley Company, L.L.C., Marlborough, MA (US)

( * ) Notice: Subject to any disclaimer, the term of this patent is extended or adjusted under 35 U.S.C. 154(b) by 106 days.

(21) Appl. No.: 09/977,588

(22) Filed: Oct. 13, 2001

(65) Prior Publication Data

US 2002/0074231 A1 Jun. 20, 2002

Related U.S. Application Data

(60) Provisional application No. 60/240,241, filed on Oct. 13, 2000.

(51) Int. Cl.[7] ........................ C25D 17/16; C25D 21/10; C25D 3/38

(52) U.S. Cl. ........................ 205/143; 205/148; 205/291; 205/296

(58) Field of Search ................................ 427/96, 97, 98; 205/143, 148, 291, 296

(56) References Cited

U.S. PATENT DOCUMENTS 6,139,712 A * 10/2000 Patton et al. ................ 205/143
6,261,433 B1 * 7/2001 Landau ........................ 205/96

* cited by examiner

*Primary Examiner*—Edna Wong
(74) *Attorney, Agent, or Firm*—S. Matthew Cairns

(57) ABSTRACT

Disclosed is a method of electroplating substrate such that small recessed features are completely filled with minimum thickness of the deposited metal over fields.

20 Claims, No Drawings

ELECTROPLATING METHOD

This application claims the benefit of U.S. Provisional Application(s) No(s).: APPLICATION NO(S).: FILING DATE 60/240,241 Oct. 13, 2000.

BACKGROUND OF THE INVENTION

The present invention relates generally to the field of electroplating. In particular, the present invention relates to the electroplating of electronic devices having very small recessed features.

Electroplating articles with copper coatings is generally well known in the industry. Electroplating methods involve passing a current between two electrodes in a plating solution where one electrode is the article to be plated. A common plating solution would be an acid copper plating solution containing (1) a dissolved copper salt (such as copper sulfate), (2) an acidic electrolyte (such as sulfuric acid) in an amount sufficient to impart conductivity to the bath and (3) additives (such as surfactants, brighteners, levelers and suppressants) to enhance the effectiveness and quality of plating. See generally U.S. Pat. Nos. 5,068,013; 5,174,886; 5,051,154; 3,876,513; and 5,068,013 for a discussion of copper plating baths.

Over time, a number of improvements in electroplating techniques have been made as the articles to be plated evolved in degree of difficulty and standards for plating increased. However, even with such improvements circumstances exist that can lead to plating defects.

Copper plating technology has been particularly important in the manufacture of computer circuit boards. More specifically, during circuit board manufacture, copper electrical connections are provided between various board layers by plating board through holes whereby a thin conductive copper conductive is first applied, typically using electroless copper plating techniques, followed by electroplating copper from acid copper solutions. Copper plating is also employed in circuit board manufacture to plate outer layers where final circuitry is defined. For such applications, panel plating is typically employed, where the full circuit board surface is copper plated followed by photodefining circuitry with a photoresist and then etching in a subtractive process. Alternatively an additive process can be employed, where copper circuits are produced by plating between lines defined by a resist relief image.

More recently, copper plating also has been employed in semiconductor chip manufacture to provide chip interconnections, replacing aluminum conductors. Industry continually demands enhanced performance, including ultra large-scale integration and faster circuits. Consequently, chip interconnects are required at dimensions of 200 nm and less. At such geometries, the resistivity of aluminum (theoretically $2.65 \times 10^{-8}$ ohm/meter at room temperature) is considered too high to allow the electronic signal to pass at required speeds. Copper, with a theoretical resistivity of $1.678 \times 10^{-8}$ ohm/meter, is a more suitable material to meet the next generation of semiconductor microchips.

Typical processes for defining semiconductor chip interconnects, particularly aluminum interconnects, have involved reactive ion etching of metal layers, e.g. a process that includes metal deposition, photolithographic patterning, line definition through reactive ion etching and dielectric deposition. However, in copper-based systems, reactive ion etching is not practical as a result of the paucity of copper compounds with vapor pressures sufficient to enable removal of the copper as may be desired.

Consequently, alternative strategies have developed, such as the Damascene process. That process starts with deposition of dielectric typically by chemical vapor deposition of silicon materials or organic dielectrics followed by curing, or spin coating silicon materials or organic dielectrics. Patterning by photolithographic processes and reactive ion etching defines the vias and trenches (interconnects) in the dielectric. Barrier layers are then formed by chemical vapor deposition or other methods to isolate the copper lines from the dielectric. Copper is then deposited and excess material removed by chemical or mechanical polishing processes.

Although conventional copper plating systems can be suitable for plating vias and trenches as small as 300 nm with 4:1 aspect ratios, defects such as seams, voids and inclusions can occur with conventional methods when attempting to plate features that are smaller or have higher aspect ratios. Such defects can occur as a result of conformal copper plating, i.e. where all targeted surfaces are plated at the same rate such that the sidewalls of a via or trench plate together forming a seam or a demarcation of disruption where the copper grains are separated and will not anneal to form a continuous copper wire. Defects also will occur at the top rim of a via hole, where electronic charge density can concentrate and result in rapid copper growth that closes off the via before the via is filled sufficiently with metal. Such inadequate metal fill can result in inclusion and voids, disrupting the ability of the plated metal to carry a coherent signal.

A semiconductor wafer is generally plated with excess copper. During the process of manufacturing an integrated circuit, a semiconductor wafer is often polished to remove the excess unwanted materials on the surface of the wafer. Polishing generally takes the form of chemical-mechanical planarization ("CMP") wherein a chemically active slurry is used in conjunction with a polishing pad.

Modern electrolyte and additive packages for filling of advanced interconnects generally use sulfuric acid, cupric sulfate, chloride ion, and two or more organic additives to assist in the formation of void free fill. Optimized fill proceeds by a 2-step fill sequence referred to as bottom-up fill. The first step is conformal fill, which electroplates copper uniformly over the wafer surface and inside features. Conformal fill transitions to the second step, bottom-up fill, once a critical feature dimension is reached during the fill process. The one consequence of bottom-up fill is the creation of excessive topography (bumps) over dense and sparse arrays. This added topography can be as high as 10 kÅ and is difficult to planarize during the CMP process.

There is thus a need for methods of electrodepositing copper on an electronic device that provide bottom-up fill of small recessed features without the creation of excessive topography over the surface of the electronic device.

SUMMARY OF THE INVENTION

It has been surprisingly found that the method of the present invention provides good bottom-up fill of recessed features in a substrate using conventional copper electroplating baths without creating excessive topography of the copper layer on the surface of the substrate. Such plated copper layer is also thinner as compared to conventional copper plating methods. Thus, the present method provides a copper layer that is more suitable for chemical mechanical planarization than that from conventional plating methods.

In one aspect, the present invention provides a method for depositing copper on a substrate including the steps of: a) providing a substrate having apertures, the substrate rotating at a speed of about 0 to 10 rpm; b) contacting the substrate with an electroplating solution including a soluble copper salt and an electrolyte for a period of time sufficient to deposit copper into the apertures, the electroplating solution having a flow rate of about 0 to 1 gpm; c) increasing the rotation of the substrate to about 20 rpm or greater; and d) contacting the substrate with the electroplating solution for a period of time sufficient to deposit a desired thickness of copper, the flow rate of the electroplating solution being about 2 gpm or greater.

In a second aspect, the present invention provides a method for manufacturing an electronic device including the steps of: a) providing a substrate having apertures, the substrate rotating at a speed of about 0 to 10 rpm; b) contacting the substrate with an electroplating solution including a soluble copper salt and an electrolyte for a period of time sufficient to deposit copper into the apertures, the electroplating solution having a flow rate of about 0 to 1 gpm; c) increasing the rotation of the substrate to about 20 rpm or greater; and d) contacting the substrate with the electroplating solution for a period of time sufficient to deposit a desired thickness of copper, the flow rate of the electroplating solution being about 2 gpm or greater.

The invention also includes articles of manufacture, including electronic packaging devices such as printed circuit boards, multichip modules, semiconductor integrated circuits and the like that contain a copper deposit produced from a plating solution of the invention.

Accordingly, in a third aspect, the present invention also provides an article of manufacture including an electronic device substrate containing one or more apertures, each aperture containing an electrolytic copper deposit obtained from the method described above.

In a fourth aspect, the present invention provides a method for removing excess material from a semiconductor wafer by using a chemical mechanical planarization process which includes contacting the semiconductor wafer with a rotating polishing pad thereby removing the excess material from the semiconductor wafer, wherein the semiconductor wafer has been prior electroplated by a copper electroplating composition according to the method including the steps of: a) providing a substrate having apertures, the substrate rotating at a speed of about 0 to 10 rpm; b) contacting the substrate with an electroplating solution including a soluble copper salt and an electrolyte for a period of time sufficient to deposit copper into the apertures, the electroplating solution having a flow rate of about 0 to 1 gpm; c) increasing the rotation of the substrate to about 20 rpm or greater; and d) contacting the substrate with the electroplating solution for a period of time sufficient to deposit a desired thickness of copper, the flow rate of the electroplating solution being about 2 gpm or greater.

In a fifth aspect, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated according to the method described above.

DETAILED DESCRIPTION OF THE INVENTION

As used throughout the specification, the following abbreviations shall have the following meanings, unless the context clearly indicates otherwise: nm=nanometers; g/L=grams per liter; ASF=amperes per square foot; M=molar; kÅ=kiloangstroms; Å=angstroms; rpm=revolutions per minute; gpm=gallons per minute; and ppm=parts per million.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refer to features that are one-half micron or smaller in size. Likewise, "small apertures" refer to apertures that are one micron or smaller in size and "very small apertures" refer to apertures that are one-half micron or smaller in size. As used throughout this specification, the term "plating" refers to metal electroplating, unless the context clearly indicates otherwise. "Deposition" and "plating" are used interchangeably throughout this specification. The term "accelerator" refers to a compound that enhances the plating rate. The term "suppressor" refers to a compound that suppresses the plating rate. "Halide" refers to fluoride, chloride, bromide, and iodide.

All percentages and ratios are by weight unless otherwise indicated. All ranges are inclusive and combinable. "Superfill" or "bottom-up fill" occurs when metal plating at the bottom of features, particularly small features, is faster than plating occurring ante top surface of the substrate to be plated. "Conformal plating" occurs when metal plating following the surface topography is occurs at the same rate as metal plating in the bottom of features, such as trenches or vias. At times, conformal plating is desired, while at other times superfill plating is desired. In the manufacture of certain electronic devices, such as wafers used in the manufacture of integrated circuits or semiconductors having small or very small features, superfill plating is desired. Particularly desired is superfill copper electroplating in such electronic device manufacture.

In general, superfill deposition occurs when the deposition rate at the bottom of the features is greater than the deposition rate at the top surface of the substrate. In conventional electroplating baths, additives such as accelerators and suppressors are added to provide such superfill behavior. As a result, excessive topography (bumps) is created over such features, particularly dense and sparse arrays. Such excessive topography creates an uneven surface which is more difficult and time consuming to planarize, such as by chemical mechanical planarization.

The present invention provides a method for electrodepositing copper on a substrate having apertures such that the apertures are substantially or completely filled with copper before a substantial thickness of copper is deposited on the surface of the substrate. In this way, a copper layer is deposited on the substrate that is thinner than copper layers available from conventional processes. Also, the copper layer has substantially reduced surface topography, i.e. bumps, are greatly reduced or eliminated over dense and sparse arrays. Such copper layers are easier to and require less time to planarize by CMP.

According to the present invention, copper is deposited on a substrate including the steps of: a) providing a substrate having apertures, the substrate rotating at a speed of about 0 to 10 rpm; b) contacting the substrate with an electroplating solution including a soluble copper salt and an electrolyte for a period of time sufficient to deposit copper into the apertures, the electroplating solution having a flow rate of about 0 to 1 gpm; c) increasing the rotation of the substrate to about 20 rpm or greater; and d) contacting the substrate with the electroplating solution for a period of time sufficient to deposit a desired thickness of copper, the flow rate of the electroplating solution being about 2 gpm or greater.

It is preferred that the rotation speed of the substrate in step a) is 0 to 5 rpm. Typically, copper is deposited on the substrate in step b) for a period of time sufficient to substantially fill the apertures, and preferably to completely fill the apertures. Once the copper deposit begins to emerge from the apertures, the rotation speed of the substrate is increased to about 20 rpm or greater, and preferably to about 20 to about 100 rpm. Once the rotation speed of the substrate has increased, the flow rate of the electroplating bath is also increased to about 2 gpm or greater, and preferably to about 2 to about 10 gpm.

During the plating of the apertures according to step b), the plating rate is approximately less than or equal to about 2000 Å/min. The exact time to fill the apertures in step b) depends upon the size of the apertures, the particular electroplating bath and the current density used. Such choices are within the ability of one skilled in the art. During the plating of the copper layer to the desired thickness according to step d), the plating rate is relatively fast as compared to step b). The plating rate in step d) is approximately greater than or equal to about 4000 Å/min. It will be appreciated that the exact plating rates in steps b) and d) will depend, for example, upon the particular organic additives in the electroplating bath and the current density used for each plating step.

While not intending to be bound by theory, it is believed that the effectiveness of the present method relies on the selectivity of additive adsorption as a function of hydrodynamic flow. Under conditions of extremely low (or zero) flow and/or wafer rotation a situation of maximum suppression (enhanced suppressor adsorption) is observed over the entire wafer surface and inside of the apertures. As the flow rate and/or wafer rotation is increased a reduction in the level of suppression (enhanced accelerator adsorption) is observed, thereby increasing the deposition rate across the flat surface. As a result, the copper deposit produced according to the present invention has greatly reduced topography and can have a very low thickness as compared to copper deposits produced by conventional methods. For example, copper deposits can be produced according to the invention having total thickness requirements reduced by 20%, preferably 25%, for a given layer as compared to those produced by conventional methods.

A wide variety of electroplating solutions may be used in the present invention. Electroplating solutions useful of the present invention generally include at least one soluble copper salt and an electrolyte. The electroplating solutions may optionally contain one or more additives, such as halides, accelerators or brighteners, suppressors, levelers, grain refiners, wetting agents, surfactants and the like. It is preferred that the electroplating solutions used in the present invention contain one or more suppressors, and more preferably one or more suppressors and one or more accelerators. It is further preferred that the electroplating solutions contain one or more halides.

A variety of copper salts may be employed in the subject electroplating solutions, including for example copper sulfates, copper acetates, copper fluoroborate, and cupric nitrates. Copper sulfate pentahydrate is a particularly preferred copper salt. A copper salt may be suitably present in a relatively wide concentration range in the electroplating compositions of the invention. Preferably, a copper salt will be employed at a concentration of from about 1 to about 300 g/L of plating solution, more preferably at a concentration of from about 10 to about 225 g/L, still more preferably at a concentration of from about 25 to about 175 g/L. The copper plating bath may also contain amounts of other alloying elements, such as, but not limited to, tin, zinc, and the like. Thus, the copper electroplating baths useful in the present invention may deposit copper or copper alloy.

Plating baths useful in the present invention employ an electrolyte, preferably an acidic electrolyte. When the electrolyte is acidic, the acid may be inorganic or organic. Suitable inorganic acids include, but are not limited to, sulfuric acid, phosphoric acid, nitric acid, hydrogen halide acids, sulfamic acid, fluoroboric acid and the like. Suitable organic acids include, but are not limited to, alkylsulfonic acids such as methanesulfonic acid, aryl sulfonic acids such as phenylsulfonic acid and tolylsulfonic acid, carboxylic acids such as formic acid, acetic acid and propionic acid, halogenated acids such as trifluoromethylsulfonic acid and haloacetic acid, and the like. Particularly suitable organic acids include $(C_1-C_{10})$alkylsulfonic acids.

Preferred acids include sulfuric acid, nitric acid, methanesulfonic acid, phenylsulfonic acid, mixtures of sulfuric acid and methanesulfonic acid, mixtures of methanesulfonic acid and phenylsulfonic acid, and mixtures of sulfuric acid, methanesulfonic acid and phenylsulfonic acid.

It will be appreciated by those skilled in the art that a combination of two or more acids may be used. Particularly suitable combinations of acids include one or more inorganic acids with one or more organic acids or a mixture of two or more organic acids. Typically, the two or more acids may be present in any ratio. For example, when two acids are used, they may be present in any ratio from 99:1 to 1:99. Preferably, the two acids are present in a ratio from 90:10 to 10:90, more preferably from 80:20 to 20:80, still more preferably from 75:25 to 25:75, and even more preferably from 60:40 to 40:60.

The total amount of added acid used in the present electroplating baths may be from about 0 to about 350 g/L, and preferably from 0 to 225 g/L. It will be appreciated by those skilled in the art that by using a metal sulfate as the metal ion source, an acidic electrolyte can be obtained without any added acid.

For certain applications, such as in the plating of wafers having very small apertures, it is preferred that the total amount of added acid be low. By "low acid" is meant that the total amount of added acid in the electrolyte is less than about 0.4 M, preferably less than about 0.3 M, and more preferably less than about 0.2 M. It is further preferred that the electrolyte is free of added acid.

The pH of the electroplating bath may be modulated either during make-up or operation to adjust the physical properties of the resulting metal deposit such as uniformity and fill. For copper electroplating baths, the pH may be adjusted upward, i.e. made less acidic, by adding solutions of basic copper salts such as copper carbonate or copper oxide to the plating bath to replenish copper ions that have been depleted during plating. Thus, the present invention also provides a method for modulating the pH of a copper electroplating bath by replenishing the bath with a solution including a basic copper salt selected from copper oxide, copper hydrate or copper carbonate.

The electrolyte may optionally contain one or more halides, and preferably does contain at least one halide. Chloride and bromide are preferred halides, with chloride being more preferred. A wide range of halide ion concentrations (if a halide ion is employed) may be suitably utilized, e.g. from about 0 (where no halide ion employed) to 100 ppm of halide ion in the plating solution, more preferably from about 25 to about 75 ppm.

A wide variety of brighteners (or accelerators), including known brightener agents, may be employed in the copper electroplating compositions of the invention. Typical brighteners contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—SO$_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—SO$_3$X or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, O or S atoms and 1–3 separate or fused rings and include e.g. coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic groups typically will have 1 to 3 N, O or S atoms and from 1 to 3 separate or fused rings and include e.g. tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include e.g. (C$_1$–C$_8$)alkoxy; (C$_1$–C$_8$)alkyl, halogen, particularly fluorine, chlorine and bromine; cyano, nitro, and the like.

More specifically, useful brighteners include those of the following formulae:

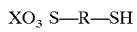

and

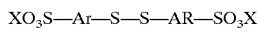

where in the above formulae R is an optionally substituted alkyl group, and preferably is an alkyl group having from 1 to 6 carbon atoms, more preferably is an alkyl group having from 1 to 4 carbon atoms; Ar is an optionally substituted aryl group such as optionally substituted phenyl or naphthyl; and X is a suitable counter ion such as sodium or potassium.

Some specific suitable brighteners include e.g. n,n-dimethyl-dithiocarbamic acid-(3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); bissulfopropyl disulfide; 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable brighteners are also described in U.S. Pat. Nos. 3,770,598, 4,374,709, 4,376,685, 4,555,315, and 4,673,469, all incorporated herein by reference. Particularly preferred brighteners for use in the plating compositions of the invention are n,n-dimethyl-dithiocarbamic acid-(3-sulfopropyl)ester and bis-sodium-sulfonopropyl-disulfide.

The amount of such accelerators present in the electroplating baths is in the range of from about 0.1 to about 1000 ppm. Preferably, the accelerator compounds are present in an amount of from about 0.5 to about 300 ppm, more preferably from about 1 to about 100 ppm, still more preferably from about 2 to about 50 ppm, and even more preferably from about 2 to about 30 ppm.

The suppressor agents useful in the compositions of the invention are polymeric materials, preferably having heteroatom substitution, particularly oxygen linkages. Generally preferred suppressor agents are generally high molecular weight polyethers, such as those of the following formula:

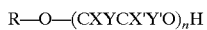

where R is an aryl or alkyl group containing from about 2 to 20 carbon atoms; each X, Y, X' and Y' is independently hydrogen, alkyl preferably methyl, ethyl or propyl, aryl such as phenyl; aralkyl such as benzyl; and preferably one or more of X, Y, X' and Y' is hydrogen; and n is an integer between 5 and 100,000. Preferably, R is ethylene and n is greater than 12,000.

The amount of such suppressors present in the electroplating baths is in the range of from about 0.1 to about 1000 ppm. Preferably, the suppressor compounds are present in an amount of from about 100 to about 800 ppm, and more preferably from about 150 to about 700 ppm.

Surfactants may optionally be added to the electroplating baths. Such surfactants are typically added to copper electroplating solutions in concentrations ranging from about 1 to 10,000 ppm based on the weight of the bath, more preferably about 5 to 10,000 ppm. Particularly suitable surfactants for plating compositions of the invention are commercially available polyethylene glycol copolymers, including polyethylene glycol copolymers. Such polymers are available from e.g. BASF (sold by BASF under TETRONIC and PLURONIC tradenames), and copolymers from Chemax.

Levelers may optionally be added to the present electroplating baths. It is preferred that one or more leveler components is used in the present electroplating baths. Such levelers may be used in amounts of from about 0.01 to about 50 ppm. Examples of suitable leveling agents are described and set forth in U.S. Pat. Nos. 3,770,598, 4,374,709, 4,376,685, 4,555,315 and 4,673,459. In general, useful leveling agents include those that contain a substituted amino group such as compounds having R—N—R', where each R and R' is independently a substituted or unsubstituted alkyl group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alkyl, halo and alkoxy.

More specifically, suitable leveling agents include, but are not limited to, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polymers; quaternized, acrylic, polymeric amines; polyvinyl carbamates; pyrrolidone; and imidazole. A particularly preferred leveler is 1-(2-hydroxyethyl)-2-imidazolidinethione.

Particularly suitable electroplating baths for use in the present invention are those including: 100 to 180 g/L of copper sulfate pentahydrate, 40 to 100 g/L sulfuric acid, 10 to 50 ppm, preferably 35 ppm, of chloride ion, 0 to 30 ppm, preferably 0 to 16 ppm, of one or more accelerator compounds and 100 to 1000 ppm, preferably 200 to 800 ppm, of one or more polymeric suppressor compounds, preferably branched chain suppressor compounds.

A wide variety of substrates may be plated with copper according to the present invention. Particularly suitable are substrates used in the manufacture of electronic devices, such as wafers used in the manufacture of integrated circuits, printed wiring board inner layers and outer layers, flexible circuits and the like. It is preferred that the substrate is a wafer.

Thus, the present invention provides a method for manufacturing an electronic device comprising the steps of: a) providing a substrate having apertures, the substrate rotating at a speed of about 0 to 10 rpm; b) contacting the substrate with an electroplating solution comprising a soluble copper salt and an electrolyte for a period of time sufficient to deposit copper into the apertures, the electroplating solution having a flow rate of about 0 to 1 gpm; c) increasing the rotation of the substrate to about 20 rpm or greater; and d) contacting the substrate with the electroplating solution for a period of time sufficient to deposit a desired thickness of copper, the flow rate of the electroplating solution being about 2 gpm or greater.

The present invention is particularly suitable for depositing copper on substrates having small apertures, and preferably very small apertures. Substrates having apertures having aspect ratios of 1:1 to 10:1, and preferably 4:1 to 10:1, may be advantageously plated with copper according to the present invention.

Accordingly, the present invention also provides an article of manufacture including an electronic device substrate containing one or more apertures, each aperture containing an electrolytic copper deposit obtained from the method of the present invention.

Once a semiconductor wafer is plated according to the present invention, the wafer is preferably subjected to chemical-mechanical planarization ("CMP"). A CMP procedure can be conducted in accordance with the invention as follows.

The wafer is mounted in a wafer carrier which urges the wafer against the surface of a moving polishing pad. The polishing pad can be a conventional smooth polishing pad or a grooved polishing pad. Examples of a grooved polishing pad are described in U.S. Pat. Nos. 5,177,908; 5,020,283; 5,297,364; 5,216,843; 5,329,734; 5,435,772; 5,394,655; 5,650,039; 5,489,233; 5,578,362; 5,900,164; 5,609,719; 5,628,862; 5,769,699; 5,690,540; 5,778,481; 5,645,469; 5,725,420; 5,842,910; 5,873,772; 5,921,855; 5,888,121; 5,984,769; and European Patent 806267. The polishing pad can be located on a conventional platen can rotate the polishing pad. The polishing pad can be held on the platen by a holding means such as, but not limited to, an adhesive, such as, two faced tape having adhesive on both sides.

A polishing solution or slurry is fed onto the polishing pad. The wafer carrier can be at a different positions on the polishing pad. The wafer can be held in position by any suitable holding means such as, but is not limited to, a wafer holder, vacuum or liquid tensioning such as, but not limited to a fluid such as, but not limited to water. If the holding means is by vacuum then there is preferably a hollow shaft which is connected to the wafer carrier. Additionally, the hollow shaft could be used to regulate gas pressure, such as, but not limited to air or an inert gas or use a vacuum to initially hold the wafer. The gas or vacuum would flow from the hollow shaft to the carrier. The gas can urge the wafer against the polishing pad for the desired contour. The vacuum can initially hold the wafer into position in the wafer carrier. Once the wafer is located on top of the polishing pad the vacuum can be disengaged and the gas pressure can be engaged to thrust the wafer against the polishing pad. The excess or unwanted copper is then removed. The platen and wafer carrier can be independently rotatable. Therefore, it is possible to rotate the wafer in the same direction as the polishing pad at the same or different speed or rotate the wafer in the opposite direction as the polishing pad.

Thus, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated by a copper electroplating composition according to the method including the steps of: a) providing a substrate having apertures, the substrate rotating at a speed of about 0 to 10 rpm; b) contacting the substrate with an electroplating solution comprising a soluble copper salt and an electrolyte for a period of time sufficient to deposit copper into the apertures, the electroplating solution having a flow rate of about 0 to 1 gpm; c) increasing the rotation of the substrate to about 20 rpm or greater; and d) contacting the substrate with the electroplating solution for a period of time sufficient to deposit a desired thickness of copper, the flow rate of the electroplating solution being about 2 gpm or greater.

Also provided is a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated according to the method described above.

While the present invention has been described with respect to copper electroplating baths, it will be appreciated by those skilled in the art that the present mixed acid electrolyte may be used with a variety of plating baths, such as tin, tin alloy, nickel, nickel-alloy, and the like.

What is claimed is:

1. A method for depositing copper on a substrate comprising the steps of: a) providing the substrate having apertures, the substrate rotating at a speed of about 0 to 10 rpm; b) electroplating copper on the rotating substrate with an electroplating solution comprising a soluble copper salt and an electrolyte for a period of time sufficient to deposit the copper into the apertures, the electroplating solution having a flow rate of about 0 to 1 gpm; c) then increasing the rotation of the rotating substrate to about 20 rpm or greater and increasing the flow rate of the electroplating solution to about 2 gpm or greater; and d) electroplating copper on the rotating substrate with the electroplating solution for a period of time sufficient to deposit a desired thickness of the copper.

2. The method of claim 1 wherein the flow rate of the electroplating solution in step c) is 2 to 10 gpm.

3. The method of claim 1 wherein the rotation rate of the substrate in step c)is 20 to 100 rpm.

4. The method of claim 1 wherein copper salt is selected from copper sulfates, copper acetates, copper fluoroborate or cupric nitrates.

5. The method of claim 1 wherein the electrolyte is acidic.

6. The method of claim 5 wherein the electrolyte comprises one or more of sulfuric acid, phosphoric acid, nitric acid, hydrogen halide acids, sulfamic acid, fluoroboric acid, alkylsulfonic acids, aryl sulfonic acids, carboxylic acids and halogenated acids.

7. The method of claim 5 wherein the electrolyte is free of added acid.

8. The method of claim 1 wherein the electroplating solution further comprises one or more accelerators, suppressors, levelers, grain refiners, wetting agents and surfactants.

9. The method of claim 1 wherein the electroplating solution further comprises a halide.

10. The method of claim 9 wherein the halide is present in an amount of 25 to 75 ppm.

11. A method for manufacturing an electronic device comprising the steps of: a) providing a substrate having apertures, the substrate rotating at a speed of about 0 to 10 rpm; b) electroplating copper on the rotating substrate with an electroplating solution comprising a soluble copper salt and an electrolyte for a period of time sufficient to deposit the copper into the apertures, the electroplating solution having a flow rate of about 0 to 1 gpm; c) then increasing the rotation of the rotating substrate to about 20 rpm or greater and increasing the flow rate of the electroplating solution to about 2 gpm or greater and d) electroplating copper on the rotating substrate with the electroplating solution for a period of time sufficient to deposit a desired thickness of the copper.

12. The method of claim 11 wherein the flow rate of the electroplating solution in step c) is 2 to 10 gpm.

13. The method of claim 11 wherein the rotation rate of the substrate in step c) is 20 to 100 rpm.

14. The method of claim 11 wherein the copper salt is selected from copper sulfates, copper acetates, copper fluoroborate or cupric nitrates.

15. The method of claim 11 wherein the electrolyte is acidic.

16. The method of claim 15 wherein the electrolyte comprises one or more of sulfuric acid, phosphoric acid, nitric acid, hydrogen halide acids, sulfamic acid, fluoroboric acid, alkylsulfonic acids, aryl sulfonic acids, carboxylic acids and halogenated acids.

17. The method of claim 15 wherein the electrolyte is free of added acid.

18. The method of claim 11 wherein the electroplating solution further comprises one or more accelerators, suppressors, levelers, grain refiners, wetting agents and surfactants.

19. The method of claim 11 wherein the electroplating solution further comprises a halide.

20. The method of claim 19 wherein the halide is present in an amount of 25 to 75 ppm.

* * * * *